(12) United States Patent
Huang et al.

(10) Patent No.: US 9,449,933 B2
(45) Date of Patent: Sep. 20, 2016

(54) PACKAGING DEVICE AND METHOD OF MAKING THE SAME

(75) Inventors: Chang-Chia Huang, Hsinchu (TW);
Tsung-Shu Lin, New Taipei (TW);
Ming-Da Cheng, Jhubei (TW);
Wen-Hsiung Lu, Jhonghe (TW);
Bor-Rung Su, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 97 days.

(21) Appl. No.: 13/434,256

(22) Filed: Mar. 29, 2012

(65) Prior Publication Data
US 2013/0256870 A1 Oct. 3, 2013

(51) Int. Cl.
*H01L 21/768* (2006.01)
*H01L 23/482* (2006.01)
*H01L 23/00* (2006.01)
*H01L 23/498* (2006.01)

(52) U.S. Cl.
CPC .............. *H01L 24/16* (2013.01); *H01L 23/498* (2013.01); *H01L 21/76895* (2013.01); *H01L 23/4824* (2013.01); *H01L 24/04* (2013.01); *H01L 24/05* (2013.01); *H01L 24/13* (2013.01); *H01L 2224/0401* (2013.01); *H01L 2224/056* (2013.01); *H01L 2224/05556* (2013.01); *H01L 2224/05567* (2013.01); *H01L 2224/05572* (2013.01); *H01L 2224/131* (2013.01); *H01L 2224/13083* (2013.01); *H01L 2224/13144* (2013.01); *H01L 2224/13147* (2013.01); *H01L 2224/13155* (2013.01); *H01L 2224/13164* (2013.01); *H01L 2224/16238* (2013.01); *H01L 2224/81191* (2013.01); *H01L 2224/81815* (2013.01); *H01L 2924/00014* (2013.01); *H01L 2924/01322* (2013.01); *H01L 2924/15311* (2013.01)

(58) Field of Classification Search
CPC ... H01L 23/498; H01L 23/48; H01L 23/538; H01L 21/28; H01L 21/302; H01L 21/76895; H01L 23/4824; H01L 24/04
USPC ........ 438/666, 669; 257/773, 775, 737–739; 228/180.22
See application file for complete search history.

(56) References Cited

U.S. PATENT DOCUMENTS

| | | | | |
|---|---|---|---|---|
| 4,289,834 A * | 9/1981 | Alcorn | .............. | H01L 21/32136 257/758 |
| 4,294,782 A | 10/1981 | Froehlig | | |
| 6,228,466 B1 * | 5/2001 | Tsukada et al. | .............. | 428/209 |
| 6,229,209 B1 * | 5/2001 | Nakamura et al. | ........... | 257/737 |
| 6,396,707 B1 * | 5/2002 | Huang et al. | ................. | 361/760 |
| 6,404,051 B1 * | 6/2002 | Ezawa | ................ | H01L 23/3171 257/692 |
| 6,809,415 B2 * | 10/2004 | Tsukada | ............... | H05K 3/3452 174/257 |
| 7,019,407 B2 * | 3/2006 | Chen et al. | ................... | 257/778 |
| 7,193,324 B2 * | 3/2007 | Hsu | ............... | 257/758 |

(Continued)

FOREIGN PATENT DOCUMENTS

WO 03/041130 5/2003

*Primary Examiner* — David Zarneke
(74) *Attorney, Agent, or Firm* — Eschweiler & Associates, LLC

(57) ABSTRACT

A device includes a first and a second package component. A metal trace is disposed on a surface of the first package component. The metal trace has a lengthwise direction. The second package component includes a metal pillar, wherein the second package component is disposed over the first package component. A solder region bonds the metal pillar to the metal trace, wherein the solder region contacts a top surface of the metal trace.

19 Claims, 7 Drawing Sheets

(56) References Cited

U.S. PATENT DOCUMENTS

| | | | | |
|---|---|---|---|---|
| 7,253,510 | B2* | 8/2007 | Harvey | 257/686 |
| 8,563,416 | B2* | 10/2013 | Erwin et al. | 438/613 |
| 8,884,432 | B2* | 11/2014 | Sakuma | H01L 23/49816 257/734 |
| 9,123,704 | B2* | 9/2015 | Sasaki | H01L 23/481 |
| 9,318,460 | B2* | 4/2016 | Sakuma | H01L 24/17 |
| 2002/0053466 | A1* | 5/2002 | Kusui | 174/260 |
| 2003/0148593 | A1* | 8/2003 | Okamoto | H01L 21/563 438/455 |
| 2005/0056445 | A1* | 3/2005 | Orui | H05K 3/3452 174/535 |
| 2007/0284420 | A1* | 12/2007 | Tan et al. | 228/180.22 |
| 2008/0217768 | A1* | 9/2008 | Miranda et al. | 257/737 |
| 2009/0051036 | A1* | 2/2009 | Abbott | 257/762 |
| 2010/0155941 | A1* | 6/2010 | Matsuki et al. | 257/737 |
| 2010/0283152 | A1* | 11/2010 | Chen | H01L 21/28518 257/741 |
| 2013/0143361 | A1* | 6/2013 | Lin | H01L 21/6835 438/110 |
| 2013/0256879 | A1* | 10/2013 | Migita et al. | 257/737 |
| 2015/0194396 | A1* | 7/2015 | Safai | H01L 24/48 257/773 |

* cited by examiner

PACKAGING DEVICE AND METHOD OF MAKING THE SAME

BACKGROUND

Bump-on-Trace (BOT) structures were used in flip chip packages, wherein metal bumps are bonded onto metal traces in package substrates directly, rather than bonded onto metal pads that have greater widths than the respective connecting metal traces. The BOT structures, compared with bonding structures bound to metal pads, help to reduce chip areas, and lower the manufacturing cost of the integrated circuit (IC) having BOT structures. In some applications, the BOT structures may achieve the same reliability as the conventional bond structures that are based on metal pads.

During the BOT manufacturing process, the metal bumps are soldered onto respective metal traces on the substrate by a reflow process. A reflowing process is a process in which solder is attached to a first conductive member, melted by heat, and then solidified. In some applications, the melted solder is caused to be in contact with both the first conductive member and a second conductive member, and then the solder connects the first and second conductive members after being solidified. Heating may be accomplished by passing the structure through a reflow oven or under a heating device, or by soldering individual joints with a hot air pencil.

During the reflowing process, the resulting packaging component needs to be cooled down from the hot reflow condition to room temperature. The drop in temperature would cause the metal traces and the substrate to contract. Because the metal traces and the substrate have different coefficient of thermal expansions (CTEs), the mismatch in the respective CTEs creates stress at the interface between the metal traces and the substrate. The CTE mismatch and the stress caused by the mismatch would result in the trace being dislocated from the substrate, which is also referred to as a phenomenon called "peeling." This dislocation of the metal traces from the substrate, i.e., peeling, would cause the packaging device to fail prematurely.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Packages comprising Bump-on-Trace (BOT) structures are provided in accordance with embodiments. The variations of the embodiments are discussed. Throughout the various views and illustrative embodiments, like reference numbers are used to designate like elements.

Figure 1:
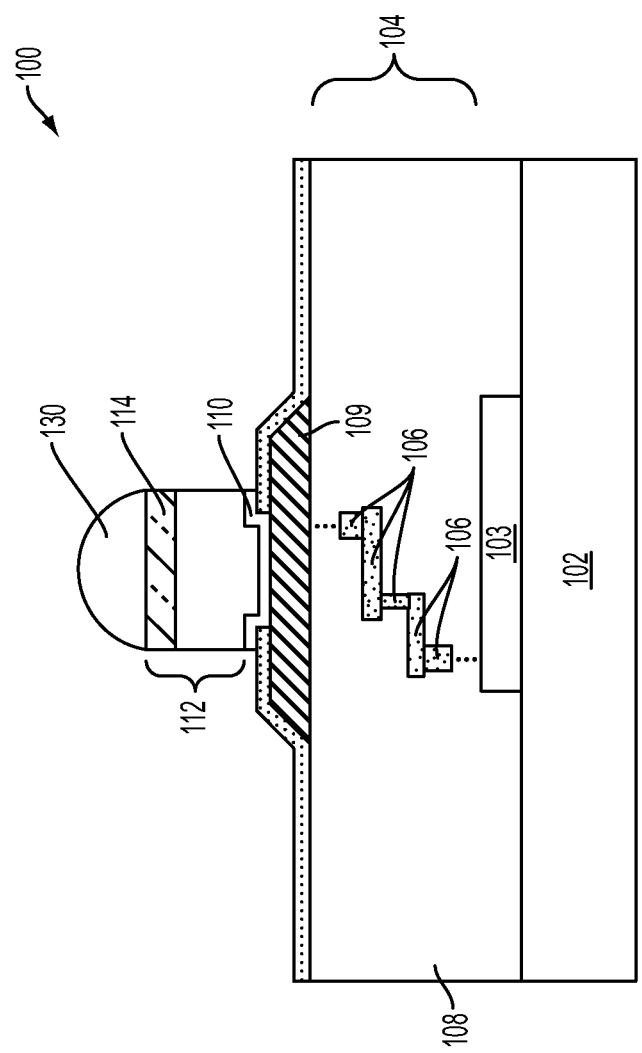
FIG. 1 is a cross-sectional view of a first package component in accordance with one or more embodiments.

FIG. 1 is a cross-sectional view of package component 100 in accordance with one or more embodiments. In some embodiments, package component 100 is a device die that includes active devices 103 (such as transistors) therein. In some alternative embodiments, package component 100 is a passive component that does not have active devices therein. In an embodiment wherein package component 100 is a device die, substrate 102 may be a semiconductor substrate such as a silicon substrate, although it may include other semiconductor materials. Interconnect structure 104, which includes metal lines and vias 106 formed therein and connected to active devices 103, is formed over substrate 102. In some embodiments, metal lines and vias 106 comprise a material including copper or copper alloys, and are formed using damascene processes. Interconnect structure 104 may include an Inter-Layer Dielectric (ILD) and Inter-Metal Dielectrics (IMDs) 108. IMDs 108 may comprise low dielectric constant (low-k) dielectric materials, and may have dielectric constants (k values) lower than about 3.0. The low-k dielectric materials may also be extreme low-k dielectric materials having k values lower than about 2.5, for example. Package component 100 may further include metal pad 109, Under-Bump Metallurgy (UBM) 110 on metal pad 109, and metal pillar 112 on UBM 110. Metal pillar 112 may comprise a copper pillar, and hence is referred to as copper pillar 112, copper-containing bump 112, or metal bump 112 hereinafter. Metal pillar 112 may further comprise a nickel layer, a palladium layer, a gold layer, or multilayers thereof, which layer(s) are collectively identified by reference numeral 114. In at least one embodiment, solder cap 130 may be formed on copper pillar 112, for example, by plating a solder layer on the top of copper pillar 112, and then reflowing the solder layer.

Figure 2A:
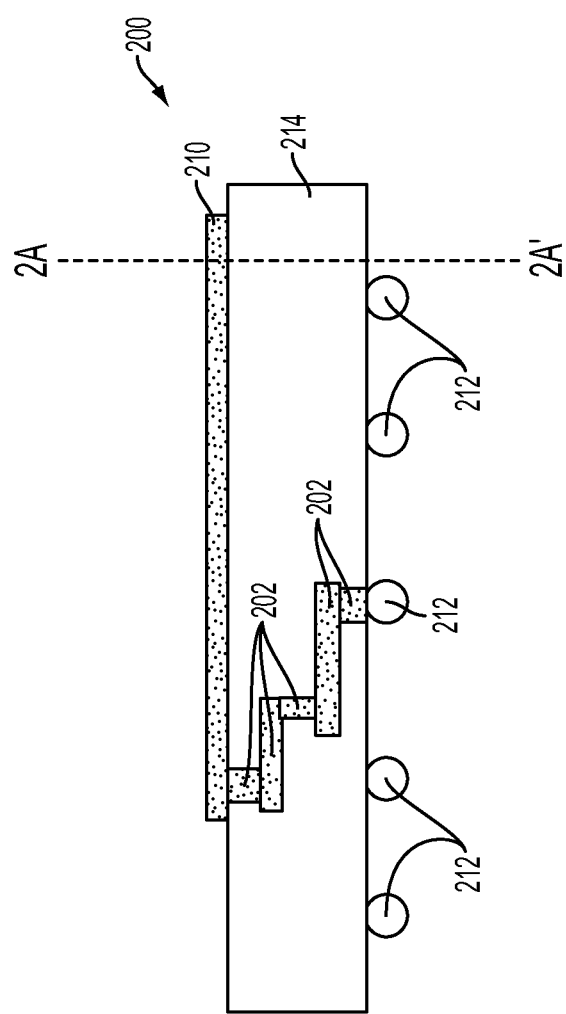
FIGS. 2A and 2B are cross-sectional views of a second package component in accordance with one or more embodiments.

FIG. 2A is a cross-sectional view of another package component 200. Package component 200 may be a package substrate, although it may be another type of package component such as an interposer, for example. Package component 200 may include metal lines and vias 202 interconnecting the metal features that are on opposite sides of package component 200. In at least one embodiment, metal trace 210 is located at a top surface of package component 200, and may be electrically connected to connectors 212 on the bottom side of package components 200 through metal lines and vias 202. Connectors 212 may be solder balls, metal pillars with solder caps thereon, metal pads, or the like. Metal lines and vias 202 may be formed in dielectric layers 214, which may be laminate films, for example. In some alternative embodiments, metal lines and vias 202 may be formed in a semiconductor substrate (such as a silicon substrate, not shown) or a dielectric core (not shown), and also in the dielectric layers that are formed on the semiconductor substrate or the dielectric core. In some embodiments, metal trace 210 comprises a material including copper, aluminum copper, tungsten, nickel, palladium, gold, and/or combinations thereof.

Figure 2B:
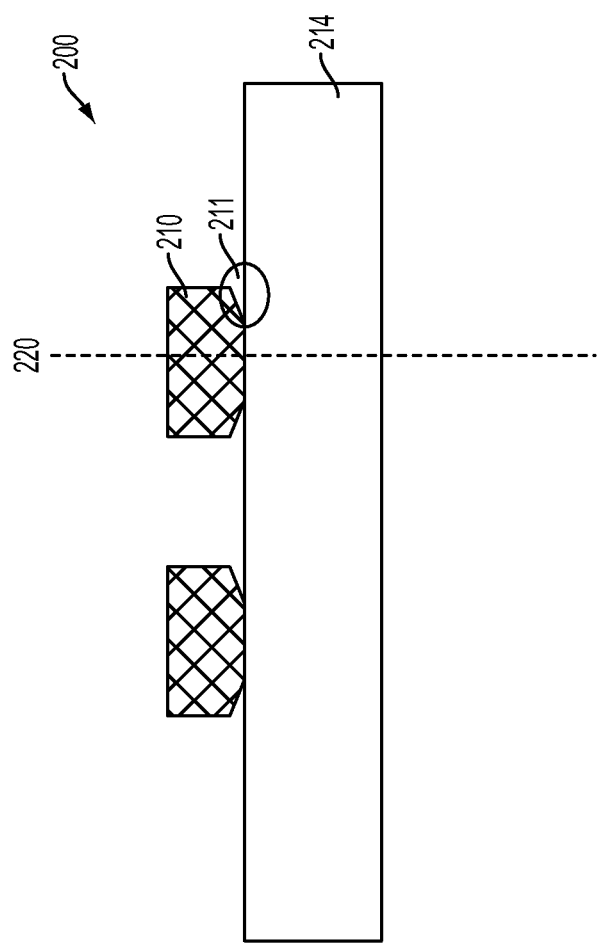

FIG. 2B is a cross-sectional view of the package structure 200 shown in FIG. 2A, wherein the cross-sectional view is obtained from the plane crossing line 2A-2A' in FIG. 2A. As shown in FIG. 2B, when metal traces 210 were formed on the substrate 214, undercuts 211 appear on the two edges along the length of the metal traces 210 at the interface between the metal traces 210 and the substrate 214. During the heating and the subsequent cooling in conjunction with performing a reflow process, the stress caused by thermal contraction and expansion and CTE mismatch as discussed above would cause the undercuts 211 to develop into cracks. These cracks would propagate toward the centerlines 220 of the metal traces 210 and thereby eventually "peel" the metal traces 210 away from the substrate.

Figure 3:
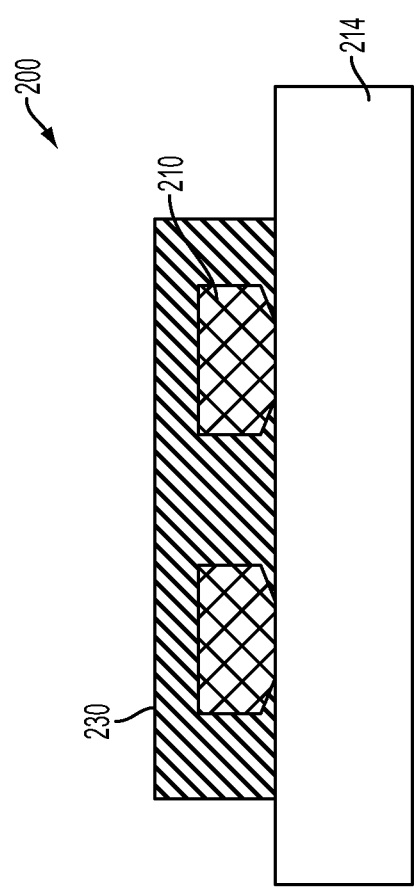
FIGS. 3 and 4 are cross sectional views of the second package component at different processing stages in accordance with one embodiment of the present disclosure.

FIG. 3 is a cross sectional view of the second package component 200 after a liquid molding process in accordance to this disclosure. In some embodiments, before the packaging components 100 and 200 are being assembled into one integrated piece of packaging device, a liquid molding process is applied to the packaging component 200. The liquid molding process comprises injecting a liquid molding material 230, such as a curable liquid, over the package component 200, so that the curable liquid 230 fills the undercuts 211 on the sides of the metal traces 210. In this embodiment, as FIG. 3 shows, the curable liquid 230 covers the entirety of metal traces 210. The liquid molding process can be carried out by any applicable means using applicable liquid molding apparatus. In some embodiments, the curable liquid 230 is formed by using the process and apparatus described in U.S. Pat. No. 4,294,782.

Figure 4:
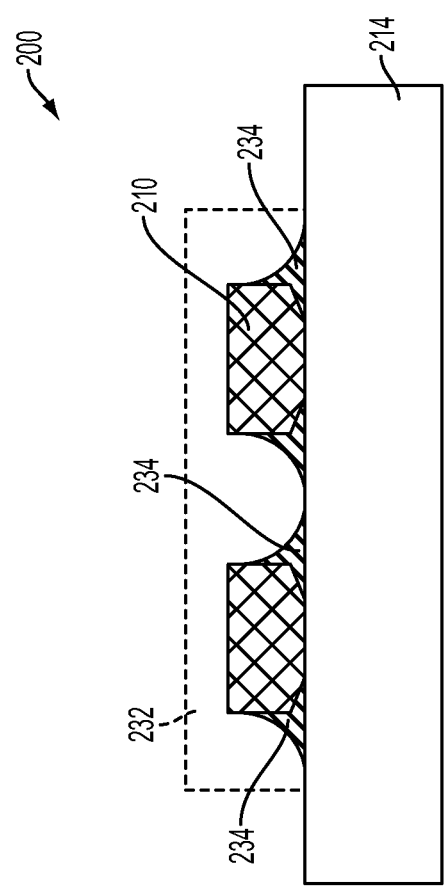

FIG. 4 is a cross sectional view of the second package component 200 after a plasma treatment in accordance to this disclosure. Thereafter, the overmolded surface of the metal traces 210 is treated by plasma. In some embodiments, the plasma treatment is performed according to a process similar to the one described in WO 2003/41130. Plasma treatment discussed here can comprise exposing the package component 200 to a gaseous state activated by a form of energy externally applied and includes, but not limited to, corona discharge, dielectric barrier discharge, flame, low pressure glow discharge, and atmospheric glow discharge treatment. The gas used in this plasma treatment can be air, ammonia, argon, carbon dioxide, carbon monoxide, helium, hydrogen, crypton, neon, nitrogen, nitrous oxide, oxygen, ozone, water vapor, combinations thereof, and others. In some alternative embodiments, other more reactive gases or vapors can be used, either in their normal state of gases at the process application pressure or vaporized with a suitable device from otherwise liquid states, such as hexamethyldisiloxane, cyclopolydiethylsiloxane, cyclopolyhydrogenmethylsiloxanes, cyclopolyhydrogenmethyl-co-dimethylsiloxanes, reactive silanes, and combinations thereof. As FIG. 4 shows, while the plasma removes the liquid molding material (as represented by the dotted region 232) above the top surfaces of the metal traces 210, a portion of the liquid molding material 234 that fills the undercuts 211 remains.

In this embodiment, the package component 200 may be overmolded using a curable liquid organic composition, a curable liquid silicone-organic copolymer composition, or a curable liquid silicone composition. The type of curable liquid composition selected depends on various factors including the type of die attach adhesive used.

Examples of suitable curable liquid organic compositions include curable liquid epoxies, curable liquid cyanate esters, and combinations thereof. Examples of suitable curable liquid silicone-organic copolymer compositions include curable liquid compositions that cure to form poly(diorganosiloxane/organic) block copolymers such as poly(diorganosiloxane/amide) copolymers.

Suitable curable liquid silicone compositions include condensation reaction curable liquid silicone compositions; addition reaction curable liquid silicone composition; ultraviolet radiation initiated curable liquid silicone compositions; and/or free radical initiated curable liquid silicone compositions.

Addition reaction curable silicone compositions may be used to minimize by-products formed when curing, as compared to the other types of curable liquid silicone compositions. The addition reaction curable liquid silicone compositions may comprise (a) an organopolysiloxane having an average of at least two alkenyl groups per molecule, (b) an organohydrogenpolysiloxane having an average of at least two silicon atom-bonded hydrogen atoms per molecule, and (c) a hydrosilylation catalyst. The addition reaction curable liquid silicone composition may further comprise one or more optional ingredients selected from (d) a filler, (e) a treating agent for the filler, (f) a catalyst inhibitor, (g) a solvent, (he) an adhesion promoter, (i) a photosensitizer, (j) a pigment, (k) a flexibilizer, and combinations thereof.

Suitable fillers for component (d) include reinforcing fillers such as silica (e.g., fumed silica, fused silica, and ground silica), titania, and combinations thereof. In some alternative embodiments, component (d) may be thermally conductive, electrically conductive, or both. In some alternative embodiments, component (d) may comprise a combination of conductive and nonconductive fillers. Component (d) may comprise DRAM grade filler or a mixture of DRAM grade filler and filler of a lesser purity than DRAM grade filler. Component (k) may comprise a long chain alpha-olefin, e.g., an olefin with 14 or more carbon atoms.

The curable liquid may be a one-part composition or a multiple-part composition such as a two-part composition. When an addition reaction curable liquid silicone composition is formulated as a one-part composition, a hydrosilylation catalyst inhibition may be included. When an addition reaction curable liquid silicone composition is formulated as a multiple part composition, any silicone containing ingredients are stored separately from any hydrosilylation catalyst.

The curable liquid is formulated to have a viscosity that will minimize wire sweep under the liquid injection molding conditions. Without wishing to be bound by any theory, it is thought that viscosity that is too high will contribute to wire sweep, however, viscosity that is too low may allow the curable liquid to leak from the mold. For some addition reaction curable liquid silicone compositions viscosity may be 80 to 3,000 Poise.

The curable liquid may be cured at a predetermined temperature for a predetermined period of time to have a cure speed that will minimize wire sweep under the liquid injection molding conditions. A cure speed that is too fast may contribute to wire sweep, however, cure speed that is too slow may render the process inefficient. For some addition reaction curable liquid silicone compositions, the curing of the curable liquid is performed at 80 to 240° C. for 30 to 120 seconds, or alternatively at 80 to 180° C. for 30 to 60 seconds, or alternatively at 80 to 150° C. for 30 to 60 seconds.

Figure 5A:
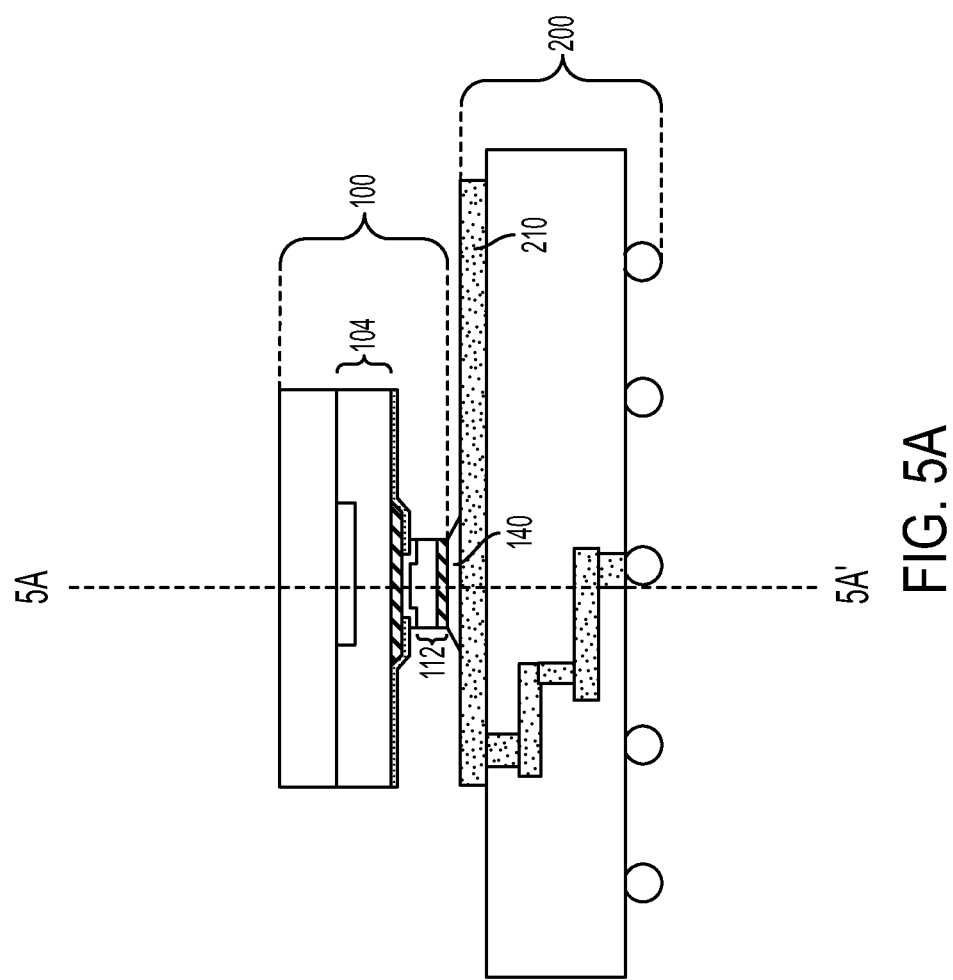
FIGS. 5A and 5B are cross-sectional views of a package comprising the first and the second package components.

Referring to FIG. 5A, package components 100 and 200 are bonded with each other through solder region 140 (alternatively referred to as a solder bump). Solder cap 130 in package component 100 (FIG. 3) may be reflowed to form an entirety or a portion of solder bump 140. Solder bump 140 may be formed of a lead-free solder, a eutectic solder, or the like. Solder bump 140 is bonded to, and contacts, the top surface of metal trace 210, wherein the top surface faces package component 100. After the bonding of package components 100 and 200, an underfill (not shown) may be filled into the space between package components 100 and 200. Accordingly, the underfill is also filled into the space between neighboring metal traces 210, and may contact metal trace 210. In some alternative embodiments, no underfill is dispensed, while the air fills the space between package components 100 and 200, and fills the space between neighboring metal traces 210.

Figure 5B:
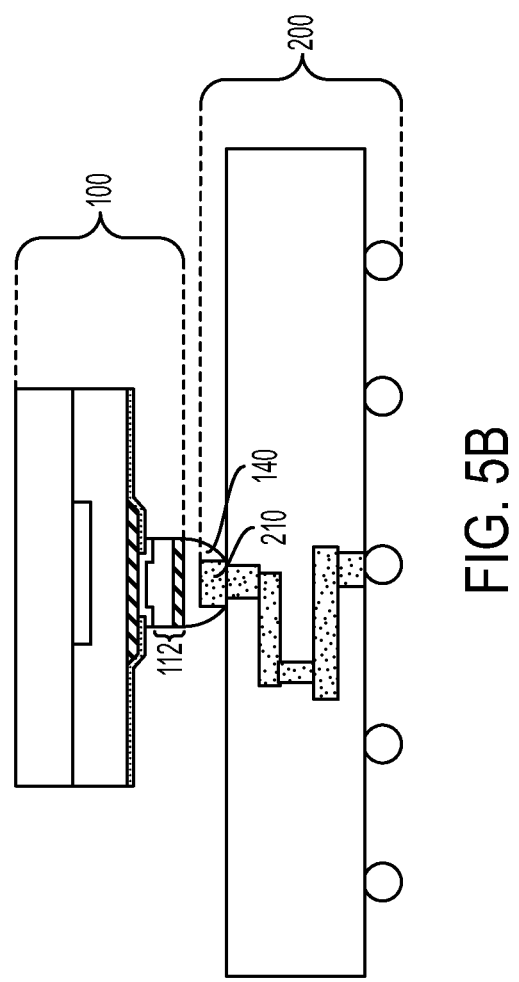

FIG. 5B is a cross-sectional view of the package structure shown in FIG. 5A, wherein the cross-sectional view is obtained from the plane crossing line 5B-5B' in FIG. 5A. As shown in FIG. 5B, solder bump 140 may contact the opposite edges of metal trace 210. In some applications, the bond structure comprising copper pillar 112, solder bump 140, and metal trace 210 collectively are also referred to as a BOT structure. Note that in this embodiment, the undercuts 211 on both sides of the metal traces 210 have been filled with liquid molding material (as depicted in FIG. 4).

In some embodiments, by filling the undercuts 211 of the metal traces 210 at the interface between the metal traces 210 and the substrate 214, the undercuts 211 are protected from stresses caused by CTE mismatching, and the creation of cracks initiating at the undercuts 211 is prevented. Accordingly, the chances for "peeling," which is caused by propagation of cracks originating from the undercuts 211 at the edges of the metal traces 210, may be reduced.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first package component;
a metal trace on a surface of the first package component, wherein the metal trace has a lengthwise direction, and wherein the metal trace comprises an undercut along the lengthwise direction;
a molding material that fills the undercut along the lengthwise direction of the metal trace and slopes downwardly away from a side of the metal trace along the lengthwise direction, a top portion of the side of the metal trace being free of the molding material and an entirety of the molding material being below a top surface of the metal trace; and
a solder region contacting the top surface and the top portion of the side of the metal trace above the molding material.

2. The device of claim 1, further comprising:
a metal pillar arranged between the solder region and a metal pad on a surface of a second package component;
an under-bump metallurgy having a non-planar topology, which is arranged between the metal pillar and the metal pad; and
wherein the second package component is disposed over the first package component and the solder region contacts the metal pillar.

3. The device of claim 1, wherein the metal trace comprises copper, tungsten, nickel, palladium, gold, or alloys thereof.

4. The device of claim 2, wherein the second packaging component comprises a substrate, and wherein an interconnect structure, which includes metal lines and vias formed therein, is formed over the substrate.

5. The device of claim 4, wherein the interconnect structure comprises an inter-layer dielectric layer.

6. The device of claim 2, wherein the metal pillar comprises a copper pillar or a copper-containing bump.

7. The device of claim 1, wherein the molding material comprises a curable organic composition comprising curable epoxies, curable cyanate esters, or combinations thereof.

8. The device of claim 1, wherein the molding material comprises a curable silicone composition comprising a condensation reaction curable silicone composition, an addition reaction curable silicone composition, an ultraviolet radiation initiated curable silicone composition, or a free radical initiated curable silicone composition.

9. A method of making a semiconductor packaging device comprising:
providing a packaging component containing metal traces that have undercuts;
applying a molding material over the packaging component so that the molding material fills the undercuts;
plasma treating a surface of the packaging component to remove portions of the molding material such that the molding material slopes downwardly away from sides of the metal traces above the undercuts, top portions of the sides of the metal traces above the undercuts being free of the molding material, and an entirety of the molding material being below top surfaces of the metal traces; and
forming a solder region contacting the top surfaces and top portions of the sides of the metal traces above the molding material.

10. The method of claim 9, wherein the molding material comprises a curable organic composition, a curable silicone-organic copolymer composition, or a curable silicone composition.

11. The method of claim 9, further comprising curing the molding material at a temperature ranging from 80° C. to 240° C. for a period ranging from 30 seconds to 120 seconds.

12. A package comprising:
a first package component comprising:
a metal trace on a surface of the first package component, wherein the metal trace has a lengthwise direction, and wherein the metal trace comprises an undercut along the lengthwise direction; and
a molding material that fills the undercut along the lengthwise direction of the metal trace and slopes downwardly away from a first side of the metal trace along the lengthwise direction, an entirety of the molding material being below a top surface of the metal trace;
a second package component disposed over the first package component, the second package component comprising:

a metal pillar; and a solder region bonding the metal pillar to the metal trace, wherein the solder region contacts the top surface of the metal trace and opposing sides of the metal trace adjacent to the top surface and above the molding material, the opposing sides of the metal trace including the first side.

13. The device of claim 1, wherein the metal trace extends beyond the solder region in the lengthwise direction.

14. The device of claim 1, wherein the solder region contacts the metal trace along a planar interface that extends between outer edges of the solder region.

15. The device of claim 2, further comprising:

a passivation layer arranged onto the surface of the second package component and extending over the metal pad to a position abutting sidewalls of the under-bump metallurgy.

16. The method of claim 9, wherein the metal traces extend beyond opposing edges of the solder region.

17. The method of claim 9, wherein the solder region contacts the metal traces along a planar interface that extends between outer edges of the solder region.

18. The package of claim 12, wherein the metal trace extends beyond the solder region in the lengthwise direction.

19. The package of claim 12, wherein the solder region contacts the metal trace along a planar interface that extends between outer edges of the solder region.

* * * * *